(12) United States Patent  
Ellis et al.

(10) Patent No.: US 9,070,481 B1
(45) Date of Patent: Jun. 30, 2015

(54) INTERNAL CURRENT MEASUREMENT FOR AGE MEASUREMENTS

(71) Applicant: SanDisk Enterprise IP LLC, Milpitas, CA (US)

(72) Inventors: Robert W. Ellis, Pheonix, AZ (US); James M. Higgins, Chandler, AZ (US); Alexander Kwok-Tung Mak, Los Altos Hills, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/298,854

(22) Filed: Jun. 6, 2014

Related U.S. Application Data

(60) Provisional application No. 62/005,975, filed on May 30, 2014.

(51) Int. Cl.
*G11C 29/08* (2006.01)
*G11C 29/50* (2006.01)
*G06F 11/30* (2006.01)
*G06F 9/455* (2006.01)

(52) U.S. Cl.
CPC ............... *G11C 29/08* (2013.01); *G11C 29/50* (2013.01); *G11C 2029/5006* (2013.01); *G06F 11/3058* (2013.01); *G06F 2212/7211* (2013.01); *G06F 2212/7202* (2013.01); *G06F 2009/45583* (2013.01)

(58) Field of Classification Search
CPC .............. G06F 11/3058; G06F 2009/45583; G06F 2212/7202; G06F 2212/7211; G11C 29/50; G11C 2029/5006
See application file for complete search history.

(56) References Cited

U.S. PATENT DOCUMENTS

| 4,916,652 | A | 4/1990 | Schwarz et al. |
| 5,270,979 | A | 12/1993 | Harari et al. |
| 5,519,847 | A | 5/1996 | Fandrich et al. |

(Continued)

FOREIGN PATENT DOCUMENTS

| EP | 1 465 203 A1 | 10/2004 |
| EP | 1 990 921 A2 | 11/2008 |

(Continued)

OTHER PUBLICATIONS

Barr, Introduction to Watchdog Timers, Oct. 2001, 3 pgs.

(Continued)

*Primary Examiner* — John P Trimmings
(74) *Attorney, Agent, or Firm* — Morgan, Lewis & Bockius LLP

(57) ABSTRACT

A method of operation in a non-volatile memory device, including executing a memory operation with respect to a portion of a non-volatile memory device, and measuring a current corresponding to current drawn by at least the portion of the non-volatile memory device during the memory operation. An age metric is determined for at least the portion of the non-volatile memory device based on age criteria including a characteristic of the measured current. In accordance with a determination that the age metric satisfies one or more predefined threshold criteria, one or more configuration parameters associated with the non-volatile memory device are adjusted. After the adjusting, data is read from and data to the portion of the non-volatile memory device according to the one or more adjusted configuration parameters.

27 Claims, 10 Drawing Sheets

(56) References Cited

U.S. PATENT DOCUMENTS

| | | |
|---|---|---|
| 5,530,705 A | 6/1996 | Malone |
| 5,537,555 A | 7/1996 | Landry |
| 5,551,003 A | 8/1996 | Mattson et al. |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |
| 5,943,692 A | 8/1999 | Marberg et al. |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,018,304 A | 1/2000 | Bessios |
| 6,070,074 A | 5/2000 | Perahia et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,295,592 B1 | 9/2001 | Jeddeloh et al. |
| 6,311,263 B1 | 10/2001 | Barlow et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,564,285 B1 | 5/2003 | Mills et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,871,257 B2 | 3/2005 | Conley et al. |
| 6,895,464 B2 | 5/2005 | Chow et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,100,002 B2 | 8/2006 | Shrader et al. |
| 7,111,293 B1 | 9/2006 | Hersh et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,571,277 B2 | 8/2009 | Mizushima |
| 7,574,554 B2 | 8/2009 | Tanaka et al. |
| 7,596,643 B2 | 9/2009 | Merry et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich |
| 7,996,642 B1 | 8/2011 | Smith |
| 8,006,161 B2 | 8/2011 | Lestable et al. |
| 8,032,724 B1 | 10/2011 | Smith |
| 8,042,011 B2 | 10/2011 | Nicolaidis et al. |
| 8,069,390 B2 | 11/2011 | Lin |
| 8,190,967 B2 | 5/2012 | Hong et al. |
| 8,254,181 B2 | 8/2012 | Hwang et al. |
| 8,259,506 B1 | 9/2012 | Sommer et al. |
| 8,312,349 B2 | 11/2012 | Reche et al. |
| 8,412,985 B1 | 4/2013 | Bowers et al. |
| 8,438,459 B2 | 5/2013 | Cho et al. |
| 8,634,248 B1 | 1/2014 | Sprouse et al. |
| 2001/0050824 A1 | 12/2001 | Buch |
| 2002/0024846 A1 | 2/2002 | Kawahara et al. |
| 2002/0083299 A1 | 6/2002 | Van Huben et al. |
| 2002/0122334 A1* | 9/2002 | Lee et al. ................. 365/185.23 |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid |
| 2003/0088805 A1 | 5/2003 | Majni et al. |
| 2003/0093628 A1 | 5/2003 | Matter et al. |
| 2003/0163629 A1 | 8/2003 | Conley et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0057575 A1 | 3/2004 | Zhang et al. |
| 2004/0073829 A1 | 4/2004 | Olarig |
| 2004/0148561 A1 | 7/2004 | Shen et al. |
| 2004/0153902 A1 | 8/2004 | Machado et al. |
| 2004/0181734 A1 | 9/2004 | Saliba |
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Shrader et al. |
| 2005/0073884 A1 | 4/2005 | Gonzalez et al. |
| 2005/0114587 A1 | 5/2005 | Chou et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1* | 11/2005 | Janzen et al. ............... 365/225.7 |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0085671 A1 | 4/2006 | Majni et al. |
| 2006/0087893 A1 | 4/2006 | Nishihara et al. |
| 2006/0107181 A1 | 5/2006 | Dave et al. |
| 2006/0136570 A1 | 6/2006 | Pandya |
| 2006/0156177 A1 | 7/2006 | Kottapalli et al. |
| 2006/0195650 A1 | 8/2006 | Su et al. |
| 2006/0259528 A1 | 11/2006 | Dussud et al. |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0091677 A1 | 4/2007 | Lasser et al. |
| 2007/0113019 A1 | 5/2007 | Beukema |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0201274 A1 | 8/2007 | Yu et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |

(56) References Cited

U.S. PATENT DOCUMENTS

| | | |
|---|---|---|
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0056005 A1 | 3/2008 | Aritome |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1* | 5/2008 | Mokhlesi ............... 365/185.17 |
| 2008/0141043 A1 | 6/2008 | Flynn et al. |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0037652 A1 | 2/2009 | Yu et al. |
| 2009/0116283 A1* | 5/2009 | Ha et al. ............... 365/185.2 |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0249160 A1 | 10/2009 | Gao et al. |
| 2009/0268521 A1* | 10/2009 | Ueno et al. ............. 365/185.11 |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0319864 A1 | 12/2009 | Shrader |
| 2010/0002506 A1 | 1/2010 | Cho et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0161936 A1 | 6/2010 | Royer et al. |
| 2010/0174959 A1 | 7/2010 | No et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2011/0051513 A1 | 3/2011 | Shen et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0173378 A1 | 7/2011 | Filor et al. |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2012/0096217 A1 | 4/2012 | Son et al. |
| 2012/0110250 A1 | 5/2012 | Sabbag et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0185750 A1 | 7/2012 | Hayami |
| 2012/0195126 A1 | 8/2012 | Roohparvar |
| 2012/0233391 A1 | 9/2012 | Frost et al. |
| 2012/0239976 A1 | 9/2012 | Cometti et al. |
| 2012/0284587 A1 | 11/2012 | Yu et al. |
| 2013/0031438 A1 | 1/2013 | Hu et al. |
| 2013/0036418 A1 | 2/2013 | Yadappanavar et al. |
| 2013/0176784 A1* | 7/2013 | Cometti et al. .......... 365/185.11 |
| 2013/0179646 A1 | 7/2013 | Okubo et al. |
| 2013/0343131 A1 | 12/2013 | Wu et al. |
| 2014/0063905 A1* | 3/2014 | Ahn et al. ............... 365/148 |
| 2014/0095775 A1 | 4/2014 | Talagala et al. |
| 2014/0122818 A1 | 5/2014 | Hayasaka et al. |
| 2014/0136927 A1 | 5/2014 | Li et al. |
| 2014/0143505 A1 | 5/2014 | Sim et al. |

FOREIGN PATENT DOCUMENTS

| | | |
|---|---|---|
| JP | 2002-532806 | 10/2002 |
| WO | WO 2007/036834 | 4/2007 |
| WO | WO 2007/080586 | 7/2007 |
| WO | WO 2008/121553 | 10/2008 |
| WO | WO 2008/121577 | 10/2008 |
| WO | WO 2009/028281 | 3/2009 |
| WO | WO 2009/032945 | 3/2009 |
| WO | WO 2009/058140 | 5/2009 |
| WO | WO 2009/084724 | 7/2009 |
| WO | WO 2009/134576 | 11/2009 |
| WO | WO 2011/024015 | 3/2011 |

OTHER PUBLICATIONS

Canim, Buffered Bloom ilters on Solid State Storage, ADMS*10, Singapore, Sep. 13-17, 2010, 8 pgs.

Kang, A Multi-Channel Architecture for High-Performance NAND Flash-Based Storage System, J. Syst. Archit., 53, 9, Sep. 2007, 15 pgs.

Kim, A Space-Efficient Flash Translation Layer for CompactFlash Systems, May 2002, 10 pgs.

Lu, A Forest-structured Bloom Filter with Flash Memory, MSST 2011, Denver, CO, May 23-27, 2011, article, 6 pgs.

Lu, A Forest-structured Bloom Filter with Flash Memory, MSST 2011, Denver, CO, May 23-27, 2011, presentation slides, 25 pgs.

McLean, Information Technology-AT Attachment with Packet Interface Extension, Aug. 19, 1998, 339 pgs.

Park et al., "A High Performance Controller for NAND Flash-Based Solid State Disk (NSSD)," Proceedings of Non-Volatile Semiconductor Memory Workshop, Feb. 2006, 4 pgs.

International Search Report and Written Opinion dated Mar. 7, 2014, received in International Patent Application No. PCT/US2013/074772, which corresponds to U.S. Appl. No. 13/831,218, 10 pages (George).

International Search Report and Written Opinion dated Mar. 24, 2014, received in International Patent Application No. PCT/US2013/074777, which corresponds to U.S. Appl. No. 13/831,308, 10 pages (George).

International Search Report and Written Opinion dated Mar. 7, 2014, received in International Patent Application No. PCT/US2013/074779, which corresponds to U.S. Appl. No. 13/831,374, 8 pages (George).

International Search Report and Written Opinion dated May 14, 2014, received in International Patent Application No. PCT/US2014/017168, which corresponds to U.S. Appl. No. 14/076,115, 6 pages (Fitzpatrick).

International Search Report and Written Opinion dated May 14, 2014, received in International Patent Application No. PCT/US2014/017169, which corresponds to U.S. Appl. No. 14/076,148, 6 pages (Fitzpatrick).

Pliant Technology, International Search Report / Written Opinion, PCT/US08/88133, Mar. 19, 2009, 7 pgs.

Pliant Technology, International Search Report / Written Opinion, PCT/US08/88136, Mar. 19, 2009, 7 pgs.

(56) References Cited

OTHER PUBLICATIONS

Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
SanDisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
International Search Report and Written Opinion dated Jul. 25, 2014, received in International Patent Application No. PCT/US2014/029453, which corresponds to U.S. Appl. No. 13/963,444, 9 pages (Frayer).

* cited by examiner

US 9,070,481 B1

INTERNAL CURRENT MEASUREMENT FOR AGE MEASUREMENTS

RELATED APPLICATIONS

This application claims priority to U.S. Provisional Patent Application No. 62/005,975, filed May 30, 2014, which is hereby incorporated by reference in its entirety.

TECHNICAL FIELD

The disclosed embodiments relate generally to storage controller systems, and in particular, to determining an age metric for and accordingly adjusting configuration parameters associated with a non-volatile memory device.

BACKGROUND

Semiconductor storage devices are commonly used for storing and managing data for electronic devices. A typical non-volatile data storage device stores data as an electrical value in the memory cells of flash memory. Flash memory, however, is typically manufactured to withstand only a finite number of program-erase cycles before physical wear on the device begins to impact both device performance and integrity.

To extend and optimize the life of flash memory, usage and performance are continuously tracked throughout the life of a device, for example to determine its level of wear, and its use is managed accordingly. Performance tracking, however, can be a time consuming and resource intensive process.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to determine an age metric for and accordingly adjust configuration parameters associated with a non-volatile memory device. In one aspect, a current drawn by at least a portion of a non-volatile memory device is measured during the execution of a memory operation, and an age metric is determined based at least in part on age criteria including a characteristic of the measured current. Configuration parameters associated with the non-volatile memory device are then adjusted in accordance with a determination that the age metric satisfies predefined threshold criteria, and after the adjusting, data is read from and written to the non-volatile memory device according to the adjusted configuration parameters.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
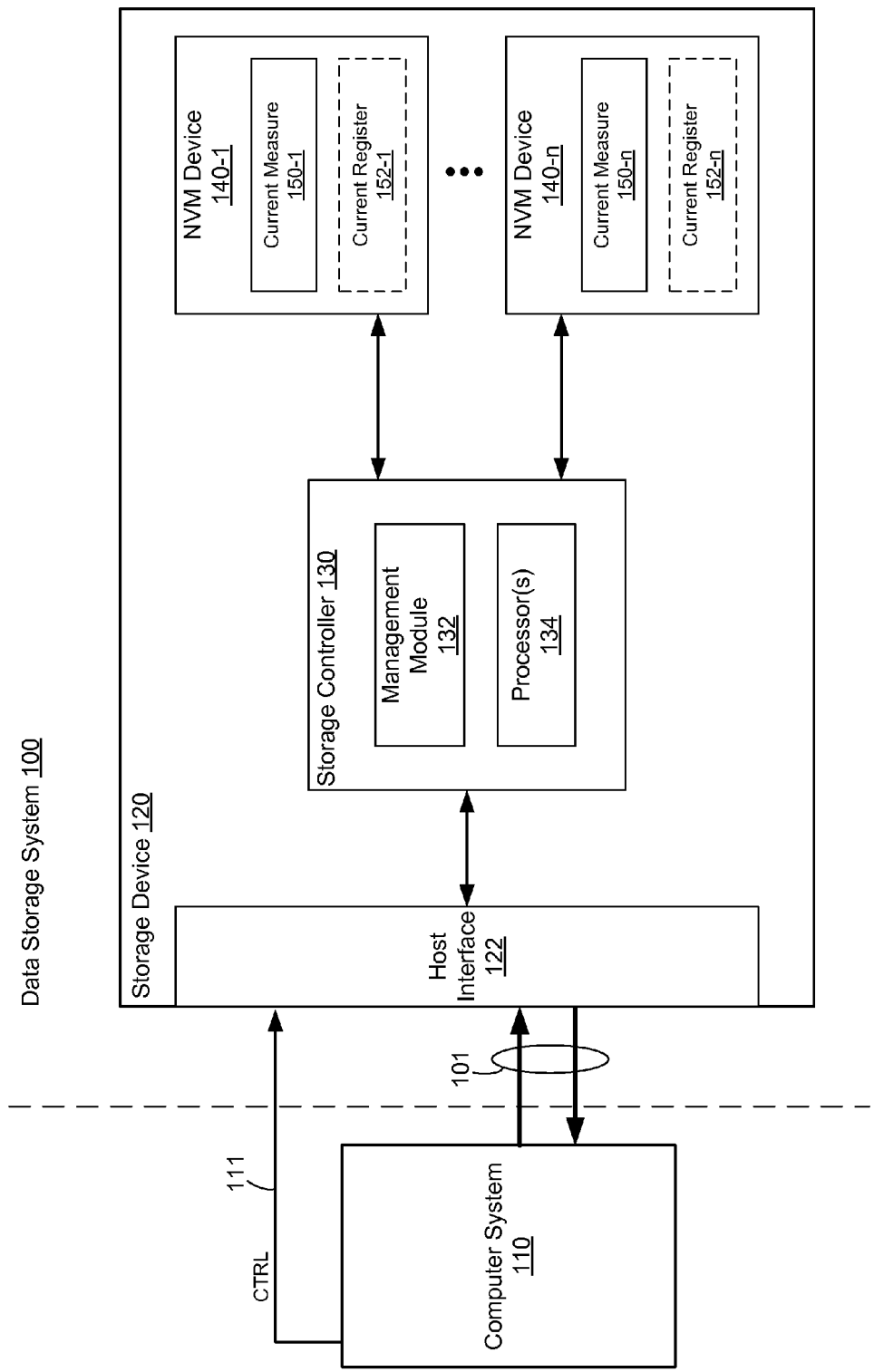
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein systems, methods and/or devices to determine an age metric for and accordingly adjust configuration parameters associated with a non-volatile memory device.

More specifically, some implementations include a method of operation in a non-volatile memory device, including executing a memory operation with respect to a portion of a non-volatile memory device. The method further includes measuring a current corresponding to current drawn by at least the portion of the non-volatile memory device during the memory operation, and determining an age metric for at least the portion of the non-volatile memory device based on age criteria including a characteristic of the measured current. Furthermore, the method includes, in accordance with a determination that the age metric satisfies one or more predefined threshold criteria, adjusting one or more configuration parameters associated with the non-volatile memory device. After the adjusting, the method includes reading data from and writing data to the portion of the non-volatile memory device according to the one or more adjusted configuration parameters.

In some embodiments, the memory operation is selected from a group consisting of: a read operation, a write operation, and an erase operation.

In some embodiments, the portion of the non-volatile memory device comprises a single erase block, sometimes called simply a block.

In some embodiments, the current is measured during a sampling window. In some implementations, the duration of the sampling window is or includes the duration of the memory operation. In some embodiments, the current is measured from a physical location internal to the non-volatile memory device.

In some embodiments, measuring the current includes measuring the current drawn across one or more bit lines corresponding to the portion of the non-volatile memory device.

In some embodiments, measuring the current is in accordance with a current measurement profile, wherein the current measurement profile is based on a type of the non-volatile memory device.

In some embodiments, the aforementioned characteristic of the measured current is a total current drawn by the portion of the non-volatile memory device over the duration of the sampling window.

In some embodiments, the age metric is determined based on age criteria further including one or more selected from the group consisting of: a program-erase (PE) cycle count corresponding to a number of PE cycles performed on the portion of the non-volatile memory device; a number of erase loops required for successfully executing the memory operation, wherein the memory operation is an erase operation; and a measured bit error rate (BER) of the portion of the non-volatile memory device.

In some embodiments, the one or more adjusted configuration parameters include at least one of: a programming parameter, a storage density of the non-volatile memory device, an error correction code (ECC) strength, and a wear leveling setting.

In some embodiments, the non-volatile memory device comprises one or more three-dimensional (3D) memory devices and circuitry associated with operation of memory elements in the one or more 3D memory devices. Furthermore, in some implementations, the circuitry and one or more memory elements in a respective 3D memory device, of the one or more 3D memory devices, are on the same substrate.

In some embodiments, at least the characteristic of the measured current is stored in a register.

In another aspect, a memory system includes (a) a plurality of non-volatile memory devices; (b) a plurality of memory controllers, including one or more processors for executing a memory operation with respect to a portion of a first non-volatile memory device, in the plurality of non-volatile memory devices; and (c) a current measurement means for measuring, for the duration of a sampling window, a current drawn by the portion of the first non-volatile memory device during the memory operation, the one or more processors further for determining an age metric based at least in part on a characteristic of the measured current.

In yet another aspect, a memory system includes (a) a plurality of non-volatile memory devices; (b) a plurality of memory controllers; (c) a processor; and (d) memory for storing one or more programs for execution by the processor, the one or more programs including instructions for performing the method of any of the methods described herein.

In yet another aspect, a non-transitory computer readable storage medium, storing one or more programs for execution by one or more processors, the one or more programs including instructions for performing any of the methods described herein.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a block diagram illustrating an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, data storage system 100 includes storage device 120 (also sometimes called an information storage device, or a data storage device, or a memory device), which includes host interface 122, storage controller 130, and non-volatile memory (NVM) (e.g., one or more NVM device(s) 140 such as one or more flash memory devices), and is used in conjunction with computer system 110. In some implementations, storage device 120 includes a single NVM device while in other implementations storage device 120 includes a plurality of NVM devices. In some implementations, NVM devices 140 include NAND-type flash memory or NOR-type flash memory. Further, in some implementations, storage controller 130 is a solid-state drive (SSD) controller. However, one or more other types of storage media may be included in accordance with aspects of a wide variety of implementations.

Computer system 110 is coupled to storage device 120 through data connections 101. However, in some implementations computer system 110 includes storage device 120 as a component and/or sub-system. Computer system 110 may be any suitable computer device, such as a personal computer, a workstation, a computer server, or any other computing device. Computer system 110 is sometimes called a host or host system. In some implementations, computer system 110 includes one or more processors, one or more types of memory, optionally includes a display and/or other user interface components such as a keyboard, a touch screen display, a mouse, a track-pad, a digital camera and/or any number of supplemental devices to add functionality. Further, in some implementations, computer system 110 sends one or more host commands (e.g., read, write, and/or erase commands) on control line 111 to storage device 120. In some implementations, computer system 110 is a server system, such as a server system in a data center, and does not have a display and other user interface components.

In some implementations, storage device 120 includes NVM devices 140 such as flash memory devices (e.g., NVM devices 140-1 through 140-n) coupled to storage controller 130. Although not shown in the Figures, in some embodiments storage device 120 includes NVM controllers (sometimes called memory channel controllers or port controllers) coupled between storage controller 130 and NVM devices 140. Alternatively, in some embodiments storage controller 130 includes a main storage controller for handling functions such as host command parsing and logical to physical address translation, and also includes a plurality of memory storage controllers for managing the NVM devices 140 in respective memory channels, including distributing individual memory operation (e.g. read, write, and erase) commands to the NVM device 140. Viewed another way, storage device 120 includes M memory channels, each of which has an NVM controller and a set of NVM devices 140 coupled to the NVM controller, where M is an integer greater than one. However, in some embodiments, two or more memory channels share an NVM controller. In either case, each memory channel has its own distinct set of NVM devices 140. In a non-limiting example, the number of memory channels in a typical storage device is 8, 16 or 32. In another non-limiting example, the number of NVM devices 140 per memory channel is typically 8, 16, 32 or 64. Furthermore, in some implementations, the number of NVM devices 140 is different in different memory channels.

Storage controller 130 is coupled to host interface 122 and NVM devices 140. In some implementations, storage controller 130 includes management module 132 for coordinating and executing commands corresponding to read, write and/or erase operations for reading data from, writing data to, or erasing data from a corresponding set of NVM devices 140. In some implementations, during a write operation, management module 132 receives data from computer system 110 through host interface 122, and during a read operation, management module 132 sends data to computer system 110 through host interface 122. In some implementations, during an erase operation, management module 132 receives an erase command from computer system 110 through host interface 122. Furthermore, in some embodiments, storage controller 130 also conveys metadata, error correction information and/or other information in addition to data values to be stored in and data values read from NVM devices 140.

In some implementations, storage controller 130 includes one or more processing units (e.g., processor(s) 134, sometimes called CPUs or processors or microprocessors or microcontrollers) configured to execute instructions in one or more programs (e.g., stored in memory in storage controller 130). As described in greater detail below with respect to FIG. 2, the one or more programs include, for example, instructions for determining an age metric for and accordingly adjusting configuration parameters associated with one or more, or a portion of, respective NVM devices 140.

In some implementations, one or more processor(s) 134 are shared by one or more components within, and in some cases, beyond the function of storage controller 130.

Host interface 122 also provides additional data, signals, voltages, and/or other information needed for communication between storage controller 130 and computer system 110. In some embodiments, storage controller 130 and host interface 122 use a defined interface standard for communication, such as double data rate type three synchronous dynamic random access memory (DDR3). In some embodiments, the defined interface standard for communication used by storage controller 130 and host interface 122 is serial advance technology attachment (SATA). In some other implementations, the defined interface standard for communication used by storage controller 130 and host interface 122 is SAS (serial attached SCSI), or other storage interface.

In some implementations, NVM devices 140 each include a current measurement circuit 150 (e.g., 150-1 through 150-n) and optionally include one or more current registers 152 (e.g., 152-1 through 152-n).

Current measurement circuit 150 is used to measure a current drawn by one or more respective NVM devices 140, or a portion thereof. In some implementations, the measured current corresponds to a current drawn during a memory operation (e.g., read, write, and/or erase operations), but in some circumstances (e.g., while an NVM device is power on, but not executing any commands) the measured current corresponds to a background/idle current drawn by a respective NVM device 140. Alternatively, the measured current is a current metric that corresponds to the current drawn by one or more NVM devices 104, or a portion of a respective NVM device 140. FIG. 1 illustrates an embodiment in which current measurement circuit 150 is an internal component of NVM device 140. However, as described in greater detail below with respect to FIGS. 3A-3D, current measurement circuit 150 is sometimes external to NVM device 140 and is a separate component of, or alternatively a device external to, storage device 120. Current measurement circuit 150 is sometimes implemented using one or more current sensors and/or other passive or active components to measure electrical characteristics of storage device 120 and its components.

In some embodiments, storage controller 130 retrieves current measurements (or alternatively, a drawn current metric associated with the current drawn) directly from current measurement circuit 150, where the current measurements are used to determine an age metric for and accordingly adjust configuration parameters associated with one or more, or a portion of, respective NVM devices 140. Optionally, current measurements, or one or more characteristics of the current measurements, are stored in current register 152 of a respective NVM device 140. In such implementations, storage controller 130 retrieves the current measurements from current register 152, as opposed to directly from current measurement circuit 150. In some embodiments (e.g., FIG. 3C), current register 152 is external to NVM device 140 and is a separate component of storage device 120. Furthermore, in some implementations, current register 152 is a component of (e.g., FIG. 3C), or optionally a component separate and distinct from (e.g., FIG. 3B), current measurement circuit 150. In some embodiments, current register 152 is implemented using high-speed random access memory, such as DRAM, SRAM, DDR RAM or other random access solid state memory devices, and/or non-volatile memory, such as one or more flash memory devices, other non-volatile solid state storage devices, magnetic disk storage devices, or optical disk storage devices. In some embodiments, current register 152 is implemented using one or more NVM devices distinct from NVM devices 140, while in other implementations, current register 152 is implemented using a designated portion of NVM devices 140. In some embodiments, current register 152 includes one or more logic gates, shift registers, clocks, flip flops, inverters, and/or other logic elements, where the foregoing elements are implemented with transistors and other active or passive electronic components.

In some embodiments, storage device 120 is configured for enterprise storage suitable for applications such as cloud computing, or for caching data stored (or to be stored) in secondary storage, such as hard disk drives. In some other embodiments, storage device 120 is configured for relatively smaller-scale applications such as personal flash drives or hard-disk replacements for personal, laptop and tablet computers. Although flash memory devices and flash controllers are used as an example here, in some embodiments storage device 120 includes other non-volatile memory device(s) and corresponding non-volatile storage controller(s).

Optionally, storage device 120 includes various additional features that have not been illustrated for the sake of brevity and so as not to obscure more pertinent features of the example implementations disclosed herein, and a different arrangement of features may be possible.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1" and otherwise the raw data value is a "0."

Figure 2:
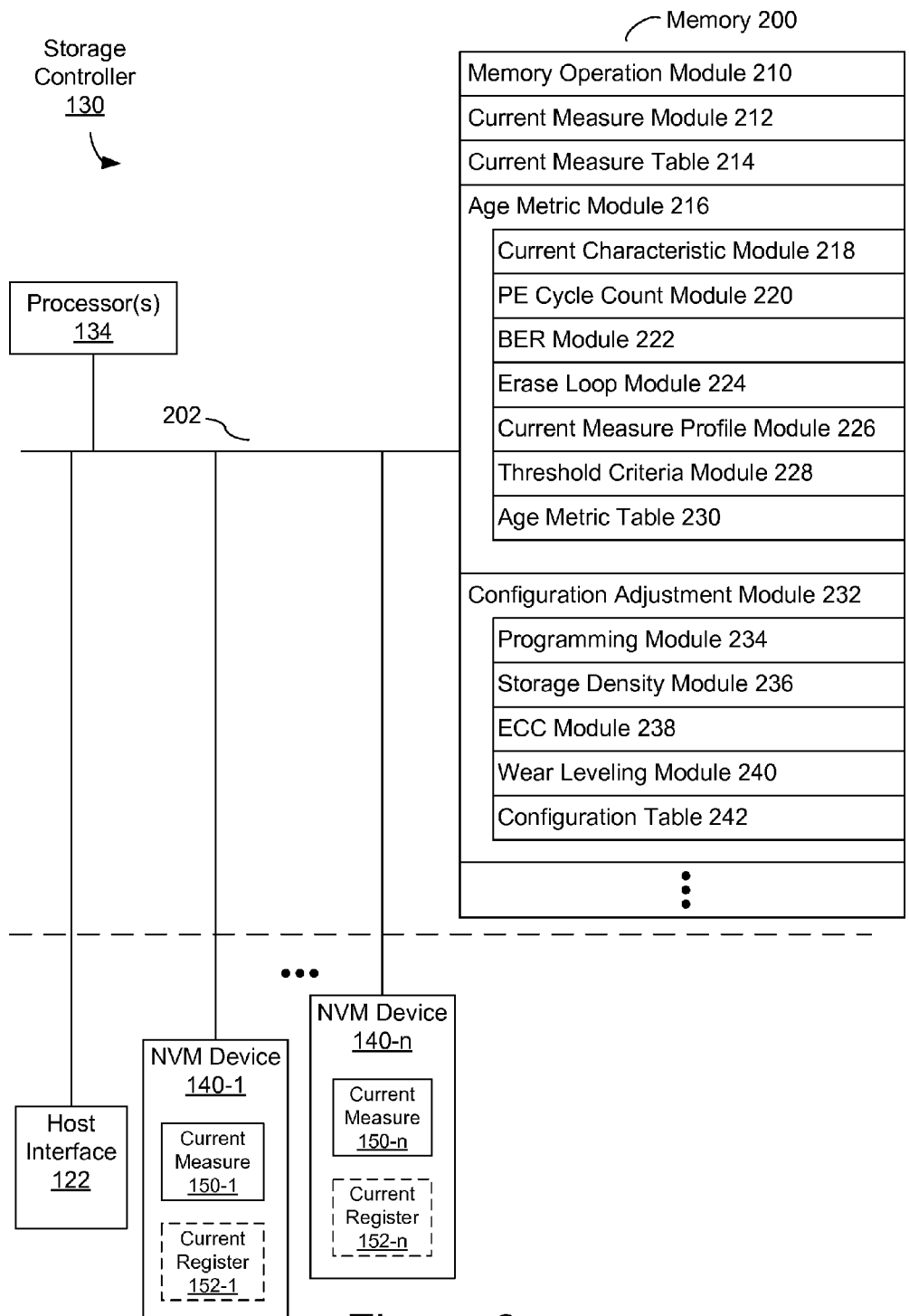
FIG. 2 is a block diagram illustrating an implementation of a storage controller, in accordance with some embodiments.

FIG. 2 is a block diagram illustrating an implementation of storage controller 130, in accordance with some embodiments. In some embodiments, storage controller 130 includes NVM devices 140-1 through 140-n, one or more processors 134 for executing modules, memory 200, programs and/or instructions stored in memory 200 and thereby performing processing operations, host interface 122, and one or more communication buses 202 for interconnecting these components. Although not shown, in some other embodiments, one or more of the functions described below as being performed by processors 134 are instead performed by one or more processors of NVM controllers coupled between storage controller 130 and NVM devices 140.

In some implementations, NVM devices 140 each include a current measurement circuit 150 (e.g., current measurement circuits 150-1 through 150-n) and an optional current register 152 (e.g., current registers 152-1 through 152-n), as described above with reference to FIG. 1. Communication buses 202 optionally include circuitry (sometimes called a chipset) that interconnects and controls communications between system components.

Memory 200 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 200 optionally includes one or more storage devices remotely located from processor(s) 134. Memory 200, or alternately the non-volatile memory device(s) within memory 200, comprises a non-transitory computer readable storage medium. In some embodiments, memory 200, or the computer readable storage medium of memory 200 stores the following programs, modules, and data structures, or a subset thereof:

- memory operation module 210, which dispatches commands corresponding to read, write and/or erase operations for reading data from, writing data to, or erasing data from NVM devices 140; in some implementations memory operation module 210 dispatches commands to memory channel controllers, which in turn dispatch the commands to NVM devices 140.
- current measure module 212, which retrieves current measurements or metrics from the current measurement circuits 150 or current registers 152 of the NVM devices 140; in some implementations current measure module 212 instructs the current measurement circuits 150 in NVM devices 140 to measure the current drawn by those devices or by particular portions of those devices; additionally, in some implementations, current measure module 212 manages when, for how long, and how frequently current measurements are taken;
- current measure table 214, which stores current measurements (or current metrics corresponding to current drawn) received from current measurement circuits 150 or current registers 152 of NVM devices 140;
- age metric module 216, which determines age metrics, based on defined age criteria, for NVM devices 140 or for respective portions of NVM devices 140;
- current characteristic module 218, which determines one or more characteristics (e.g., magnitude of an observed peak current, total current drawn, etc.) of a current measured by current measurement circuit 150, and identifies a value for each determined characteristic;
- Program-erase (PE) cycle count module 220, which determines, with respect to each NVM device 140 of a plurality of NVM devices, a current PE cycle count for the NVM device 140 or for respective portions (e.g., erase blocks) of the NVM device 140;
- Bit Error Rate (BER) module 222, which executes a sequence of commands to determine, with respect to a particular NVM device 140 of the NVM devices in storage device 120, a BER of the NVM device 140 or of respective portions of the NVM device 140; in some embodiments, the sequence of commands includes erasing portions of an NVM device 140, programming a correctable data pattern into the erased portions, and reading data from the programmed portions to calculate a BER;
- erase loop module 224, which determines a number of erase loops required for successfully executing an erase operation on a specified portion of a particular NVM device 140;
- current measure profile module 226, which instructs current measurement circuit 150 to measure a current drawn or a characteristic (e.g., a timing characteristic or peak current) of the current drawn in accordance with a current measurement profile, which is optionally based on the type of the NVM device;
- threshold criteria module 228, which determines whether an age metric of a particular NVM device 140 or portion of NVM device 140 satisfies a predefined threshold criteria (e.g., determining whether an age metric corresponding to the magnitude of a peak current during a particular type of memory operation is at least X % less than the magnitude of the peak current during that type of memory operation for (A) the same device when the device was new, or (B) a new device);
- age metric table 230, which stores previous and new values determined and/or calculated by age metric module 216 and its sub-modules (e.g., age metric values, PE cycle counts, BER values, etc.);
- configuration adjustment module 232, which, in accordance with a determination (by threshold criteria module 228) that an age metric satisfies one or more predefined threshold criteria, determines which configuration parameters associated with NVM device 140, or a portion of NVM device 140, (e.g., programming parameters, storage density, etc.) to adjust;
- programming module 234, which adjusts one or more programming parameters (e.g., threshold write voltage) of NVM device 140, or a portion of NVM device 140;
- storage density module 236, which adjusts the storage density (e.g., three bits per cell to two bits per cell) of the memory cells of NVM device 140, or a portion of NVM device 140;
- Error Correction Code (ECC) module 238, which adjusts the strength of the ECC used for detecting and correcting errors in data written to and read from NVM device 140, or a portion of NVM device 140;
- optionally, wear leveling module 240, which adjusts one or more configuration settings related to the wear leveling scheme applied to specific portions of NVM device 140 (e.g., instructing storage controller 130 to write less frequently to blocks with greater wear, based on the determined age metric); and
- configuration table 242, which stores previous and adjusted values of the various configuration parameters (e.g., programming parameters, storage density, etc.) corresponding to the sub-modules of configuration adjustment module 232.

In some embodiments, memory 200, or the computer readable storage medium of memory 200 further stores a configuration module for configuring storage controller 130. In some embodiments, upon power up and upon reset, the configuration module automatically sets the values of one or more configuration parameters of storage controller 130 in accordance with NVM devices 140 (e.g., the type of non-volatile memory) and/or characteristics of storage device 120 and/or data storage system 100, which includes storage device 120.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 200 may store a subset of the modules and data structures identified above. Furthermore, memory 200 may store additional modules and data structures not described above. In some embodiments, the programs, modules, and data structures stored in memory 200, or the computer readable storage medium of memory 200, provide instructions for implementing at least those portions of the methods described below with reference to FIGS. 5A-5C that are performed by components of storage device 120.

Although FIG. 2 shows storage controller 130, FIG. 2 is intended more as a functional description of the various features which may be present in a storage controller than as a structural schematic of the embodiments described herein. In practice, and as recognized by those of ordinary skill in the art, items shown separately could be combined and some items could be separated.

FIGS. 3A-3D illustrate various implementations of a storage device, in accordance with some embodiments. While some example features and components are illustrated, various other features and components have not been illustrated for the sake of brevity and so as not to obscure more pertinent aspects of the example implementations disclosed herein. For instance, although not illustrated, some embodiments of storage device 120 include multiple current measurement circuits, optional current registers, and NVM devices (e.g., NVM devices 140-1 through 140-n), where each NVM device has a respective set of memory elements, bit lines, word lines.

Figure 3A:
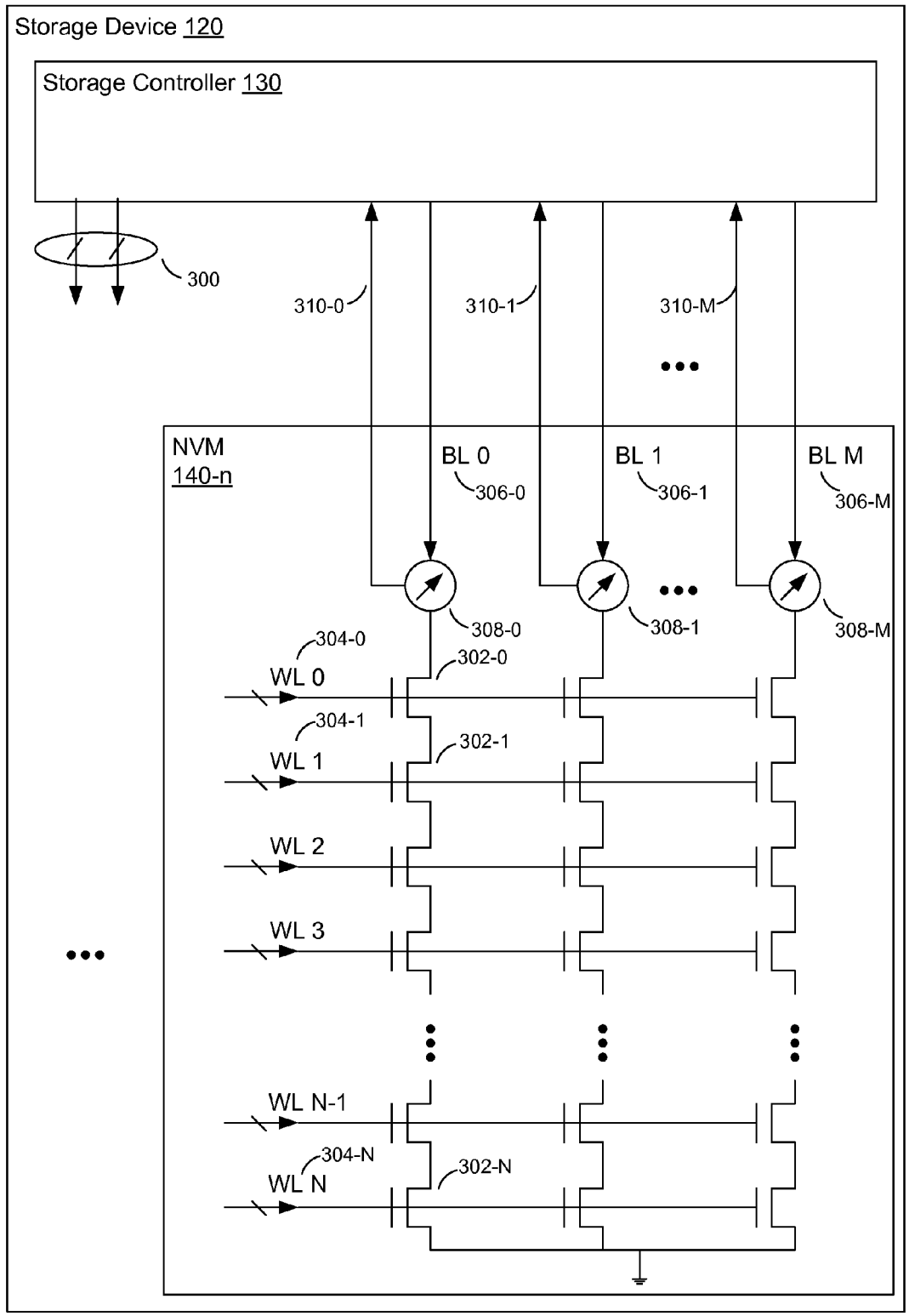
FIGS. 3A-3D illustrate various implementations of a storage device, in accordance with some embodiments.

In particular, FIG. 3A is a block diagram illustrating an implementation of a storage device with current measurement circuits internal to a non-volatile memory device, in accordance with some embodiments. As a non-limiting example, storage device 120 includes NVM devices 140 (each of which includes a set of memory elements 302 for each bit line 306), storage controller 130, bit lines 306, word lines 304, current measurement circuits 308, and one or more connections 300. In some embodiments, while a memory operation is executed by storage controller 130, a current drawn by bit lines 306 is measured by current measurement circuits 308 and accessed by storage controller 130 directly through current read lines 310. Storage controller 130 determines an age metric based on age criteria, and if the determined age criteria satisfies a predefined threshold criteria, one or more configuration parameters associated with NVM device 140-n are adjusted.

In some embodiments, NVM device 140 is configured as a memory array composed of multiple strings of memory, where each string is composed of multiple memory elements (e.g., 302-0 through 302-N) connected in series, sharing a single bit line (e.g., 306-0), and accessed as a group. In these embodiments, storage controller 130 sends signals corresponding to write and/or erase operations to one or more memory elements (e.g., 302-0 through 302-N) through write lines (e.g., 304-0 through 304-N). In particular, memory elements 302 are coupled to storage controller 130 through one or more connections 300, where connections 300 include write lines 304. In some implementations, each NVM device 140 includes multiple individually addressable blocks (e.g., erase blocks) having predefined storage capacities, where in some embodiments, each block includes multiple individually addressable pages. A combination of memory elements 302 within a respective NVM device 140 may comprise one or more blocks and/or pages. As a non-limiting example, an NVM device 140 having 512 megabytes of storage capacity includes multiple 128 kilobyte blocks, where each block includes multiple 4 kilobyte pages.

In some embodiments, a current measurement circuit (e.g., 308-0) is coupled between a respective bit line (e.g., 306-0) and a respective set of memory elements (e.g., 302-0 through 302-N). FIG. 3A illustrates one implementation in which current measurement circuits 308 are internal components of NVM device 140-n. In some embodiments (e.g., FIG. 1), current measurement circuits 308-0 through 308-M are collectively referred to as current measurement circuit 150-n of NVM device 140-n. As illustrated in FIG. 3C, in some embodiments, NVM device 140 includes a single current measurement circuit 308 positioned within the device (e.g., between a voltage source and the device's array of memory cells) so as to measure all current drawn by the entire array of memory cells in the device.

In some implementations, current measurement circuits 308 each measure a current through a respective bit line (e.g., 306-0), corresponding to a current drawn during a memory operation by a respective set of memory elements connected in series and sharing the respective bit line (e.g., memory elements 302-0 through 302-N, sharing bit line 306-0. In some implementations, a current measurement circuit 308 measures a current drawn by one or more blocks, or one or more pages of an NVM device. Furthermore, in some embodiments, a current drawn by a particular NVM device (e.g., 140-n), or an array of NVM devices (e.g., NVM devices 140-1 through 140-n), is determined by summing the current measurements of the respective current measurement circuits 308 for the NVM device. In FIG. 3A, for example, a current drawn by entire NVM device 140-n is determined by summing the current measurements of current measurement circuits 308-0 through 308-M.

As noted above, in some embodiments, a single current measurement circuit 308 located within NVM device 140 measures current drawn by an entire NVM device 140, or by all memory cells in NVM device 140.

In the embodiment shown in FIG. 3A, storage controller 130 retrieves current measurements (or alternatively, a drawn current metric associated with the current drawn) directly from current measurement circuits 308 through current read lines 310. Further discussion regarding determining an age metric for and accordingly adjusting configuration parameters associated with at least a portion of NVM device 140-n is provided below with respect to FIGS. 5A-5C.

Figure 3B:
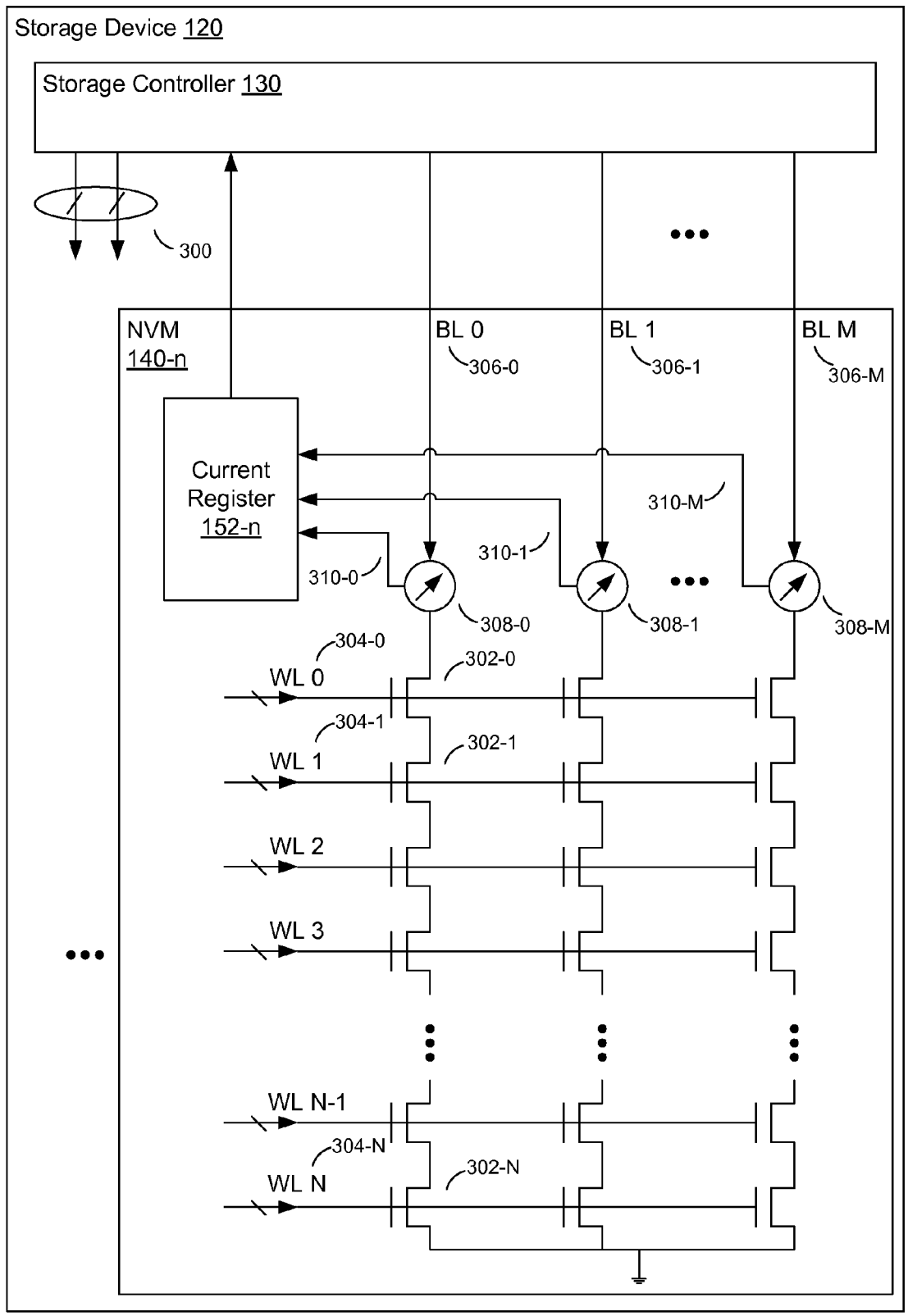
Figure 3C:
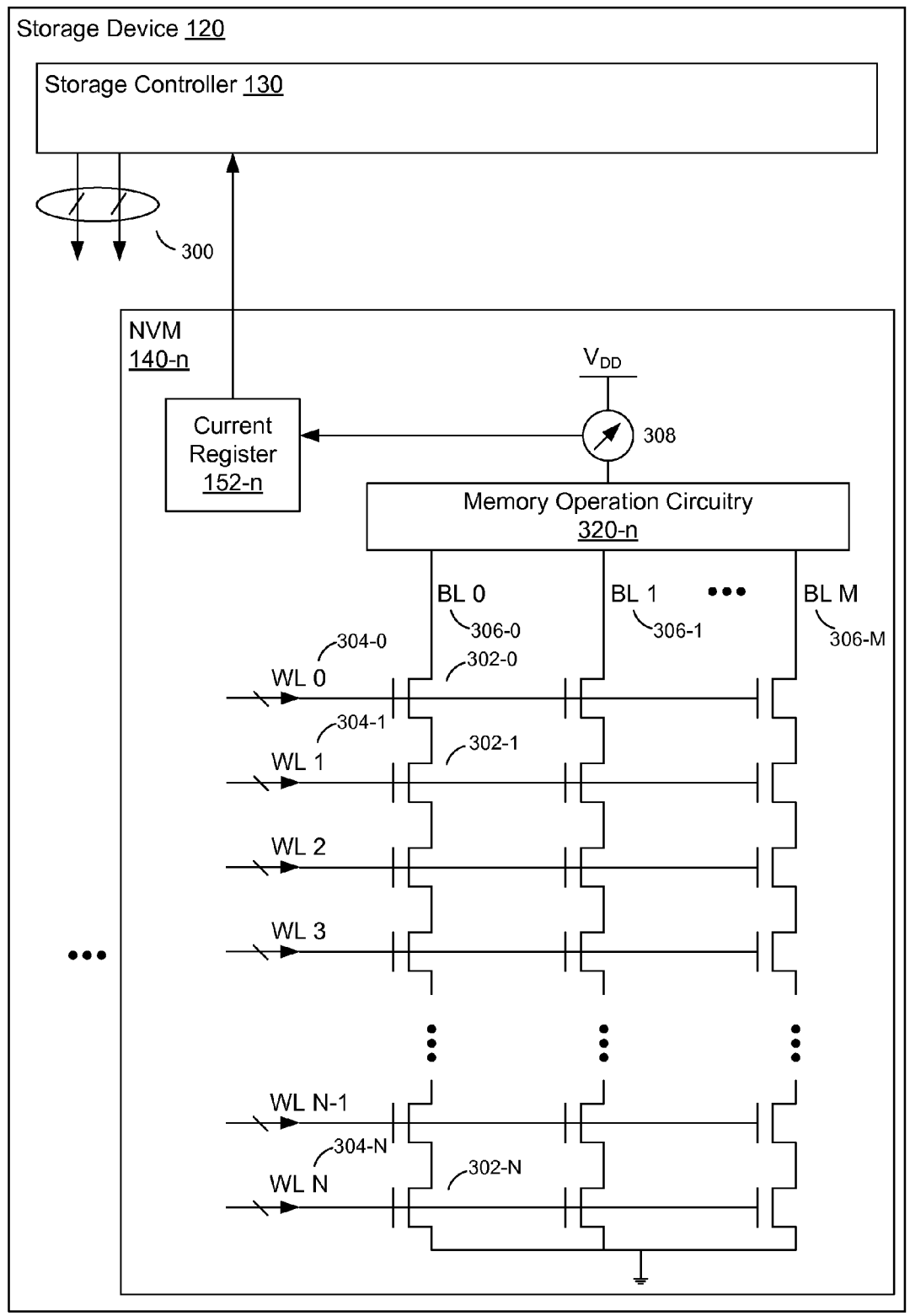

FIG. 3B is a block diagram illustrating an alternative implementation of a storage device with current measurement circuits and a current register internal to a non-volatile memory device, in accordance with some embodiments.

The alternative implementation of storage device 120 illustrated in FIG. 3B contains similar features to the implementation of FIG. 3A (see above for further discussion regarding the features and components of storage device 120). However, the alternative implementation of FIG. 3B additionally includes a current register (e.g., 152-n), internal to a respective NVM device (e.g., 140-n), to which current measurement circuits 308 are coupled through current read lines 310. As described above with respect to FIG. 1, current register 152 stores current measurements taken by current measurement circuits 308.

In such implementations, storage controller 130 retrieves current measurements from current register 152-n, as opposed to each of current measurement circuits 308. A respective current register 152, therefore, may determine a current drawn by a particular NVM device (e.g., 140-n) by summing the current measurements of the respective current measurement circuits 308. Furthermore, in such implementations, a current drawn by an array of NVM devices (e.g., 140-1 through 140-n) is determined by summing the current measurements retrieved from current registers 152-0 through 152-n.

Referring to FIG. 3C, in some embodiments a single current measurement circuit 308 located within NVM device 140 measures current drawn by an entire NVM device 140-n, or by all memory cells in NVM device 140. In the example shown in FIG. 3C, current measurement circuit 308 is positioned between an internal voltage source, labeled $V_{DD}$, and the NVM device's memory array. Further, in the example shown in FIG. 3C, current measurement circuit 308 is positioned between internal voltage source $V_{DD}$ and the NVM device's memory operation circuitry 320-n. In some implementations, memory operation circuitry 320-n includes voltage regulator and boost circuitry for generating internal voltages, sense amplifiers for reading data from memory cells, and control logic for performing read, write and erase operations. The control logic may also control when current measurements are taken by current measurement circuit 308. Optionally, one or more current measurements made by current measurement circuit 308 are stored in current register 152-n, from where they are read by controller 130.

Figure 3D:
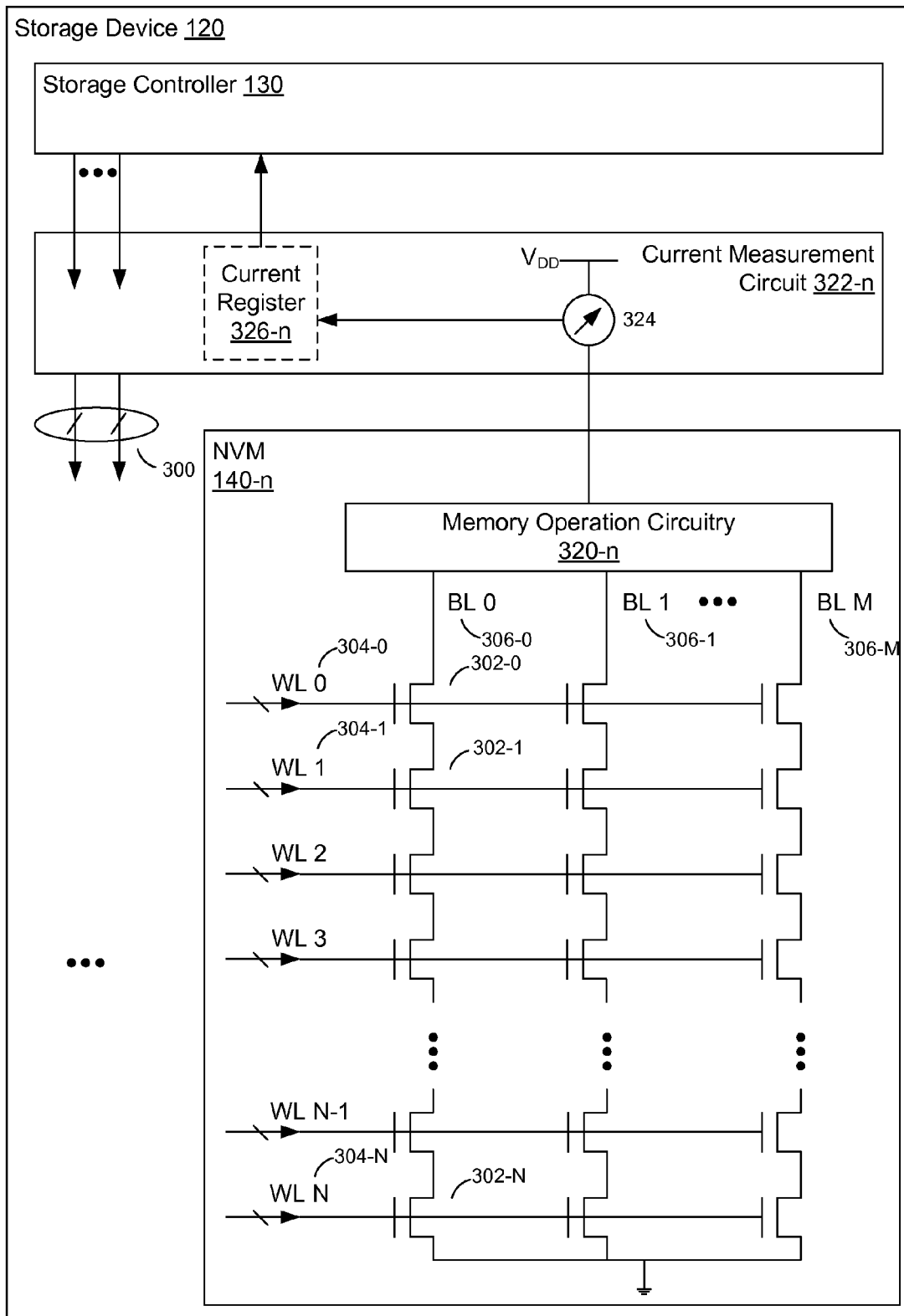

FIG. 3D is a block diagram illustrating another alternative implementation of a storage device with a current measurement circuit 322-n external to a non-volatile memory device 140-n, in accordance with some embodiments. The external current measurement circuit 322-n includes a current sensor 324 and optionally includes a current register 326-n, in accordance with some embodiments.

The alternative implementation of storage device 120 illustrated in FIG. 3D contains similar features to the implementation of FIG. 3C (see above for further discussion regarding the features and components of storage device 120). However, the alternative implementation of FIG. 3D includes a current measurement circuit 322-n external to NVM device 140-n, coupled between storage controller 130 and NVM device 140-n. In other embodiments, storage device 120 includes multiple measurement circuits 322 external to a respective NVM device 140-n for measuring current drawn by multiple distinct portions of NVM device 140-1. These implementations enable the use of external current measurement devices without needing to incorporate current measurement circuitry within NVM devices 140.

In some implementations, storage controller 130 retrieves current measurements directly from current measurement circuit 322-n, or optionally, from current register 326-n. In some implementations, a respective current register 326 determines a current drawn by a particular NVM device (e.g., 140-n) by summing the current measurements of multiple current measurement circuits 324. Furthermore, in some implementations, a current drawn by an array of NVM devices (e.g., NVM devices 140-1 through 140-n) is determined by summing the current measurements retrieved from current registers 326-0 through 326-n.

Figure 4:
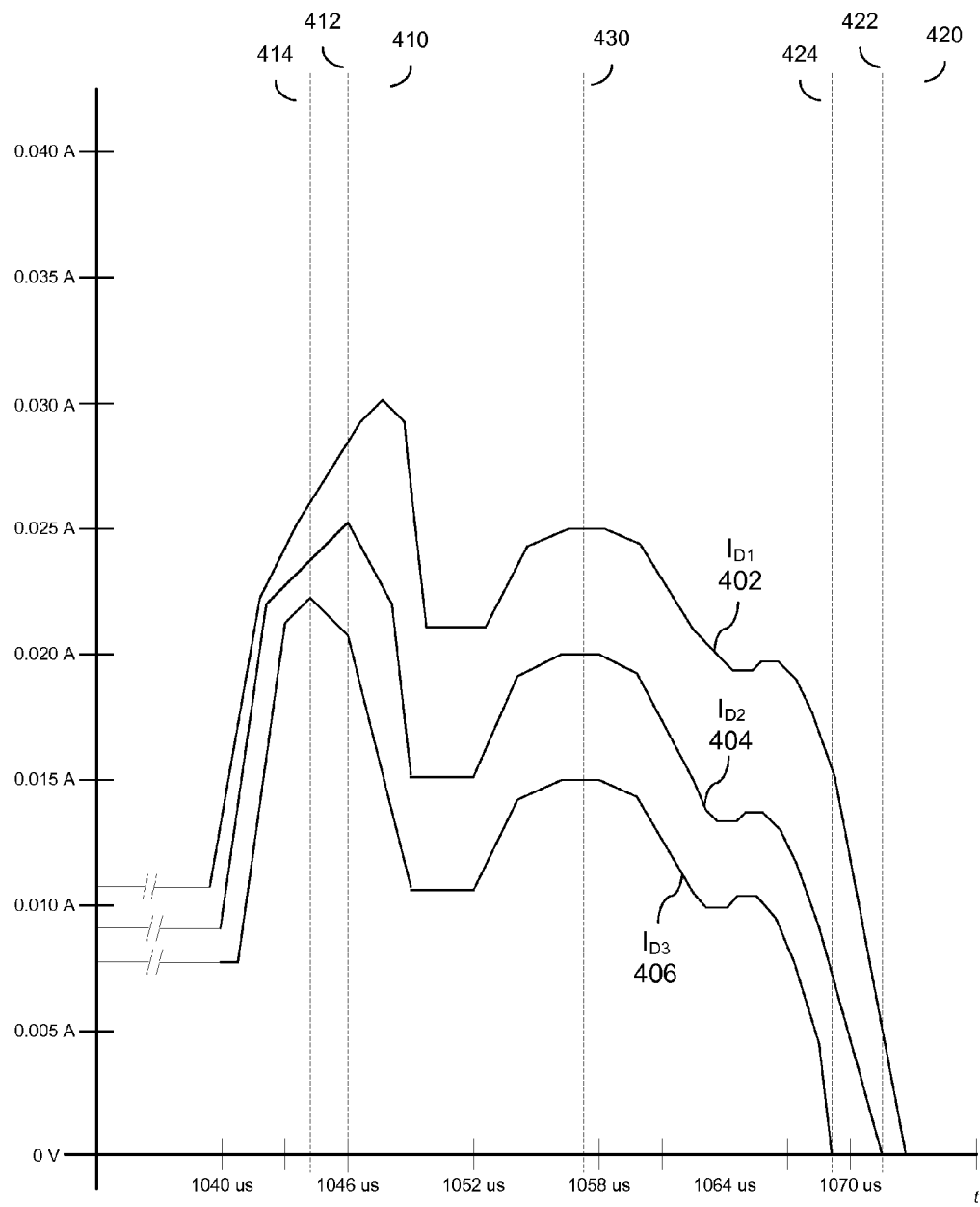
FIG. 4 is a prophetic illustration of a continuous time-domain plot of current drawn for a bit line of distinct non-volatile memory devices during an erase operation, in accordance with some embodiments.

FIG. 4 is a prophetic illustration of a continuous time-domain plot of current drawn for a bit line of distinct non-volatile memory devices during an erase operation, in accordance with some embodiments. In the example provided, each of current measurements $I_{D1}$, $I_{D2}$, and $I_{D3}$ (e.g., 402, 404, and 406, respectively) corresponds to a current drawn by at least a portion of a respective NVM device (e.g., $I_{D1}$ corresponds to the current measured on bit line 306-0 of NVM device 140-1) during an erase operation or erase verify operation. Furthermore, each respective NVM device has a distinct program-erase (PE) cycle count. For example, current measurements $I_{D1}$, $I_{D2}$, and $I_{D3}$ correspond to the current drawn by NVM devices 140-1 through 140-3, having PE cycle counts of 1000, 1500, and 2000, respectively.

An age metric is representative of the level of wear and the overall endurance of an NVM device, which, in some embodiments, is represented by a PE cycle count of the NVM device. Determining an age metric for at least the portion of an NVM device is based on age criteria, where the age criteria includes a characteristic of a measured current.

FIG. 4 illustrates exemplary characteristics of a measured current. In some embodiments, the characteristic of the measured current (e.g., $I_{D1}$) is the total current drawn by at least a portion of a respective NVM device (e.g., 140-1) over the duration of a sampling window. Based on FIG. 4, for example, the total current drawn by the NVM device corresponding to current measurement $I_{D1}$ (e.g., 140-1), determined by the integration of current measurement $I_{D1}$ over the erase operation (approx. 33 microseconds), is larger than the total current drawn by the NVM device corresponding to current measurement $I_{D2}$ (e.g., 140-1). As indicated by the example above, in which NVM device 140-1 has a lower PE cycle count (1000) than NVM device 140-2 (1500), an age metric based on a larger total current drawn will be less than an age metric based on a smaller total current drawn. Thus, in the example provided, NVM device 140-1 will have a smaller age metric compared to NVM device 140-2.

In some embodiments, the characteristic of the measured current is a peak current drawn by at least a portion of a respective NVM device (e.g., 140-1) over the duration of a sampling window. For example, in FIG. 4, the peak current drawn by the NVM device corresponding to current measurement $I_{D1}$ (e.g., 410, NVM device 140-1) is greater than the peak current drawn by the NVM device corresponding to current measurement $I_{D2}$ (e.g., 412, 140-2). As indicated by this example, in which NVM device 140-1 has a lower PE cycle count (1000) than NVM device 140-2 (1500), an age metric based on a larger peak current will be less than an age metric based on a smaller peak current. Thus, in the example provided, NVM device 140-1 will have a smaller age metric compared to NVM device 140-2.

In some embodiments, the characteristic of the measured current is a peak current drawn by at least a portion of a respective NVM device (e.g., 140-1) over the duration of a sampling window, specifically over the duration of an erase verify operation. For example, in FIG. 4, the duration between approximately 1052 microseconds and 1064 microseconds corresponds to the duration of an erase verify operation executed for NVM devices 140-1 through 140-3 (e.g., corresponding to current measurements $I_{D1}$, $I_{D2}$, and $I_{D3}$, respectively). In this example, the peak current drawn by the NVM device 140-1 (e.g., approx. 0.025 amps, at marker 430 for $I_{D1}$) during an erase verify operation is greater than the peak current drawn by the NVM device 140-2 (e.g., approx.

0.020 amps, at marker 430 for $I_{D2}$) during an erase verify operation. As indicated by this example, in which NVM device 140-1 has a lower PE cycle count (1000) than NVM device 140-2 (1500), an age metric based on peak current during an erase verify operation is inversely related to the peak current during the erase verify operation. Thus, in the example provided, NVM device 140-1 will have a smaller age metric compared to NVM device 140-2.

Further, in some embodiments, the characteristic of the measured current is a timing of a current event (e.g., how quickly the current increases above and/or falls below a predefined current level during the execution of a memory operation). In FIG. 4, for example, if a rising current threshold level is defined as 0.020 amps, $I_{D1}$ (corresponding to NVM device 140-1) increases above the rising current threshold level at an earlier time during the erase operation than $I_{D2}$ (corresponding to NVM device 140-2). In this example, in which NVM device 140-1 has a lower PE cycle count (1000) than NVM device 140-2 (1500), an age metric based on a current that increases above a predefined current threshold level more quickly will be less than an age metric based on a current that increases above a predefined current threshold level less quickly. Thus, in the example provided, NVM device 140-1 will have a smaller age metric compared to NVM device 140-2.

In another example, if a falling current threshold level is defined as 0 A, $I_{D1}$ falls (e.g., at time 420) to the falling current threshold level later than $I_{D2}$ (e.g., 422). As shown in this example, in which NVM device 140-1 has a lower PE cycle count (1000) than NVM device 140-2 (1500), an age metric based on a current that falls to (or below) a predefined current threshold level less quickly will be less than an age metric based on a current that falls below a predefined current level more quickly. Thus, in the example provided, NVM device 140-1 will have a smaller age metric compared to NVM device 140-2.

Figure 5A:
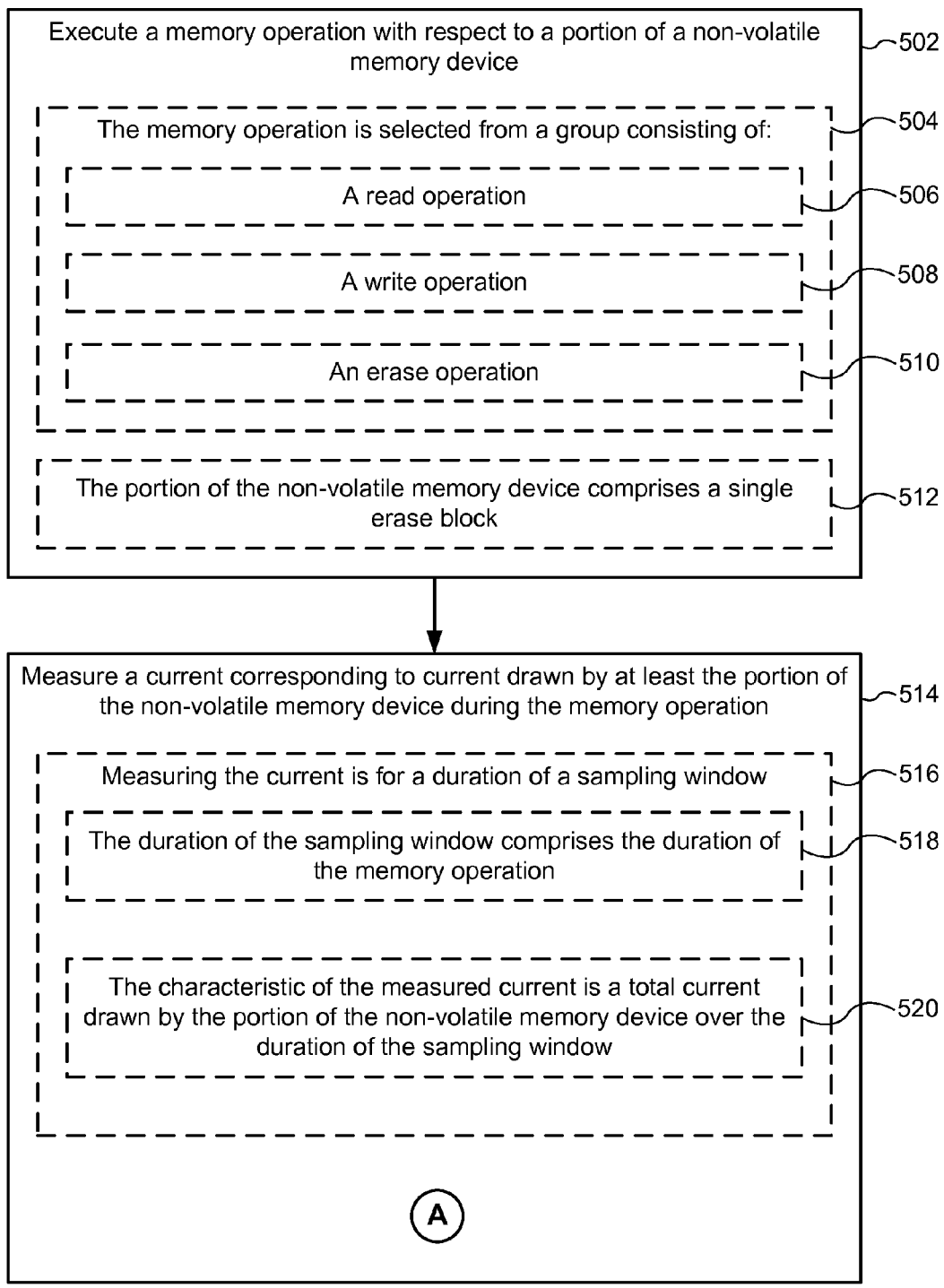
FIGS. 5A-5C illustrate a flowchart representation of a method of determining an age metric for and accordingly adjusting configuration parameters associated with a non-volatile memory device, in accordance with some embodiments.
Figure 5B:
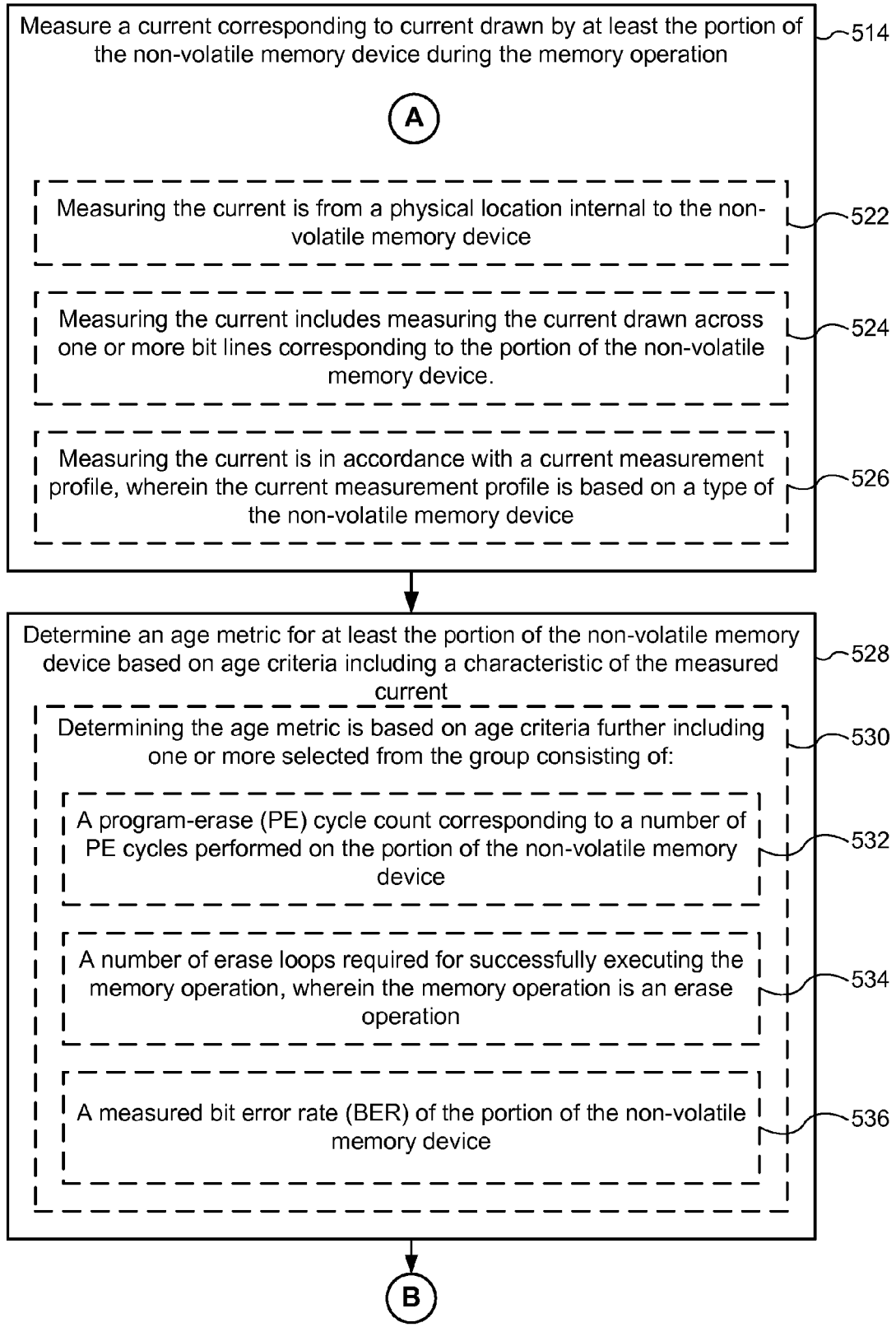
Figure 5C:
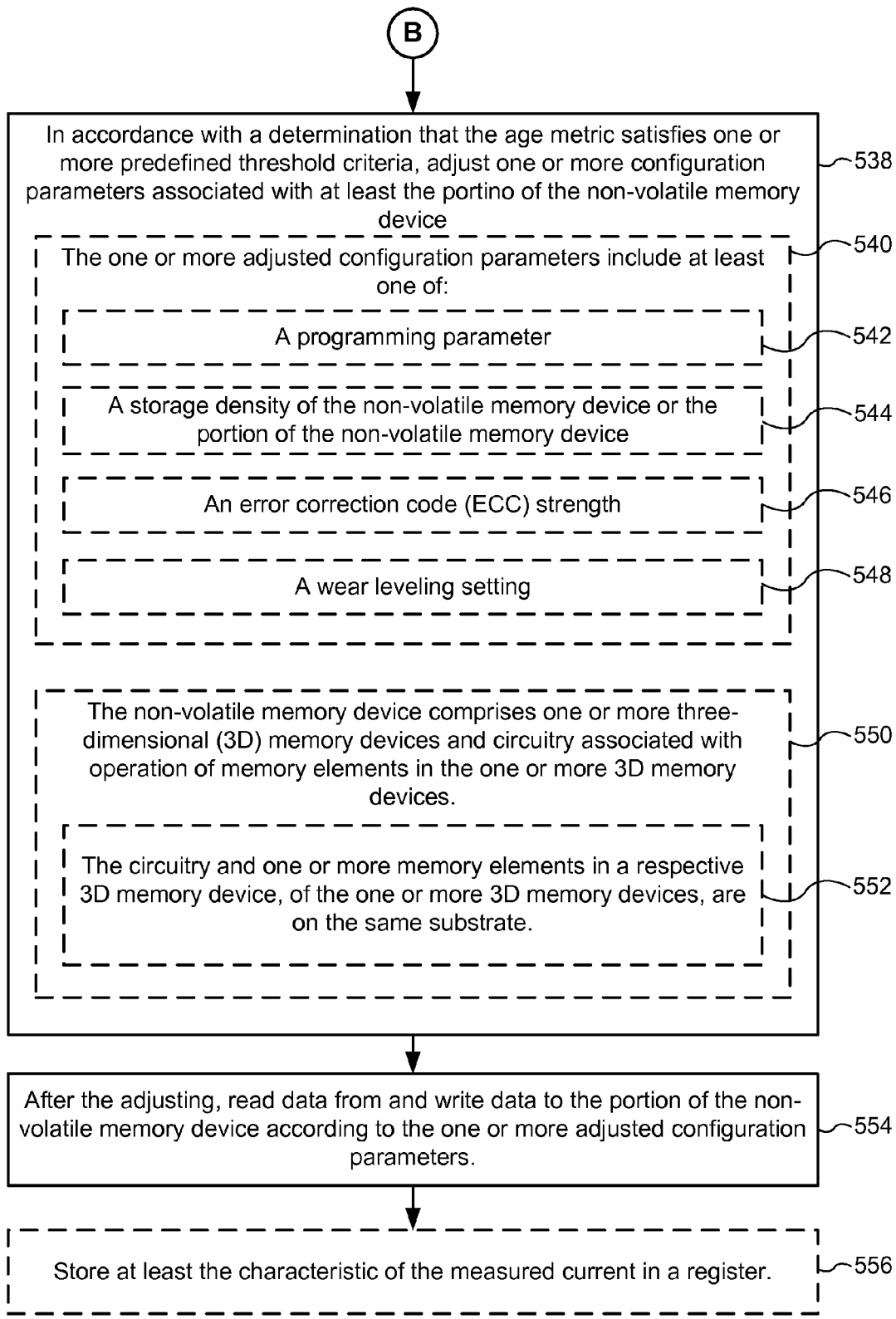

FIGS. 5A-5C illustrate a flowchart representation of a method 500 of determining an age metric for and accordingly adjusting configuration parameters associated with a non-volatile memory device, in accordance with some embodiments. A non-volatile memory system (e.g., storage device 120, FIG. 1), which includes a plurality of non-volatile memory devices (e.g., 140-1 through 140-n), coordinates and manages multiple sub-system components to determine an age metric for and accordingly adjust configuration parameters associated with at least a portion of the non-volatile memory devices.

A non-volatile memory system (e.g., storage device 120) executes (502) a memory operation with respect to a portion of a non-volatile memory device. In some embodiments, the memory operation is selected (504) from a group consisting of: a read operation (506), a write operation (508), and an erase operation (510). In some implementations, an erase operation comprises a plurality of erase loops.

In some embodiments, the portion of the non-volatile memory device comprises a single erase block (512). Portions of an NVM device 140 (e.g., multiple memory elements 302 connected in series, or a subset thereof) are described in greater detail above with respect to FIGS. 3A-3D.

A current corresponding to current drawn by at least the portion of the non-volatile memory device is measured (514) during the memory operation. As described above with respect to FIGS. 3A-3D, in some embodiments, the current drawn is by an entire NVM device (e.g., 140-n, FIG. 3A), or optionally, an array of NVM devices (e.g., 140-1 through 140-n).

In some embodiments, the current is measured (516) for the duration of a sampling window. For example, a current measurement circuit (e.g., 308-0, FIG. 3A) measures the current drawn by a portion of an NVM device (e.g., memory elements 302-0 through 302-N) for the last 45 microseconds of an erase operation. In some implementations, the duration of the sampling window comprises (518) the duration of the memory operation. For example, a current measurement circuit (e.g., 308-0, FIG. 3A) measures the current drawn by a portion of an NVM device (e.g., memory elements 302-0 through 302-N) for the duration of an erase operation lasting, for example, 1200 microseconds.

In some embodiments, measuring the current (522) is from a physical location internal to the non-volatile memory device. Additionally and/or alternatively, measuring the current is from a physical location external to the non-volatile memory device. Various embodiments for locations at which a current is measured (and thus, where current measurement circuits 150 are implemented) are described in greater detail with respect to FIGS. 3A-3D.

In some embodiments, measuring the current (524) includes measuring the current drawn across one or more bit lines corresponding to the portion of the non-volatile memory device. As described above with respect to FIGS. 3A-3D, in some implementations, measuring the current includes measuring the current drawn by a respective set of memory elements connected in series and sharing the respective bit line (e.g., memory elements 302-0 through 302-N sharing bit line 308-0, FIG. 3A).

In some embodiments, measuring the current (526) is in accordance with a current measurement profile, wherein the current measurement profile is based on a type of the non-volatile memory device. Types of the NVM devices include, for example, planar NAND, 3D (BiCS) NAND, and ReRAM.

An age metric is determined (528) for at least the portion of the non-volatile memory device based on age criteria including a characteristic of the measured current. In some embodiments, the characteristic of the measured current is a total current drawn (520) by the portion of the non-volatile memory device over the duration of the sampling window. The discussion of FIG. 4 describes in greater detail other exemplary characteristics of the measured current (e.g., a peak current drawn, a timing of a current event, etc.).

In some embodiments, the age metric is determined (530) based on age criteria further including one or more selected from the group consisting of: a program-erase (PE) cycle count (532) corresponding to a number of PE cycles performed on the portion of the non-volatile memory device; a number of erase loops (534) required for successfully executing the memory operation, wherein the memory operation is an erase operation; and a measured bit error rate (BER) (536) of the portion of the non-volatile memory device. For example, the determined age metric for NVM device 140-1, having a PE cycle count of 2500 and having drawn 0.5 milliamps of current during a 40 microseconds erase operation, will typically be higher than the determined age metric for NVM device 140-1, having a PE cycle count of 1000 and having drawn 1.0 milliamps of current during the same 40 microseconds erase operation, where a greater age metric corresponds to greater physical wear of an NVM device. In another example, an NVM device requiring a greater number of erase loops to successfully complete erasure of one or more blocks during an erase operation will typically have a greater age metric than an NVM device requiring fewer erase loops, where a greater age metric corresponds to greater physical wear of an NVM device. Furthermore, in another example, an NVM device with a greater BER than another NVM device will typically have a greater age metric, where a greater age metric corresponds to greater physical wear of an NVM device.

Although BER is a factor for determining an age metric in some embodiments, in some other embodiments the age metric is determined irrespective of the BER. An age metric, determined irrespective of the BER, reduces the amount of time for determining the overall endurance of an NVM device. In particular, the BER approach first requires programming a completely erased block and subsequently detecting an error in the programming, which is a lengthier process than determining an age metric based on age criteria that include a characteristic of a measured current. In some embodiments, the measured current is measured during performance a memory operation that is performed irrespective of the age measurement process, for example, during performance of a memory operation that is performed in response to a read or write command from a host computer, or in response to a block erase command issued by a garbage collection process.

In some implementations, the age metric is determined with an algorithm that is defined as a function of one or more age criteria. Furthermore, in some implementations, each of the one or more age criteria used in the algorithm have a respective predefined weight. In a non-limiting example, an algorithm for determining an age metric of an NVM device (e.g., 140-*n*, FIG. 1) is defined by:

$$(Age\ Metric)_{NVM-n} = X^*(I_{total}) + Y^*(PE),$$

where $I_{total}$ is the total current drawn by an NVM device (e.g., 140-*n*) for the duration of a memory operation (e.g., erase operation), PE is the program-erase count of the NVM device, and X and Y are the predefined weights of $I_{total}$ and PE, respectively.

In accordance with a determination that the age metric satisfies one or more predefined threshold criteria, one or more configuration parameters associated with at least the portion of the non-volatile memory device are adjusted (538). In some embodiments, the one or more predefined threshold criteria correspond to the age metric of a new or moderately worn NVM device (e.g., PE cycle count of 500, 1.5 milliamps of total current drawn). In an example, a predefined threshold criterion is satisfied if the age metric of an NVM device is a predefined percentage (e.g., 10%) above the age metric corresponding to the predefined threshold criteria. In some embodiments, in accordance with a determination that the age metric satisfies one or more predefined threshold criteria, one or more configuration parameters associated with a specific portion of the NVM device (e.g., bit line 306-0 of NVM device 140-*n*, shared by memory elements 302 in FIG. 3A; or, in another example, specific erase blocks of NVM device 140-*n*) are adjusted.

In some embodiments, the one or more adjusted configuration parameters include (540) at least one of: a programming parameter (542), a storage density of the non-volatile memory device or the portion of the non-volatile memory device (544), an error correction code (ECC) strength (546), and a wear leveling setting (548). In some implementations, programming parameters include one or more write voltages (starting voltage, and optionally voltage step size), a maximum number of programming pulses, and optionally a length of the programming pulses. In an example, if the age metric of NVM device 140-*n* exceeds a predefined threshold (e.g., NVM device 140-*n* has an age metric greater than that of an NVM device having a PE cycle count of 1500), storage controller 130 applies a greater write voltage to memory elements 302 through write lines 304 to better ensure successful programming of data to the memory elements. In another example, if the age metric of an NVM device (e.g., an NVM device having multi-level cell (MLC) memory elements) exceeds a predefined threshold, some or all of the MLC memory elements of the NVM device are recharacterized (sometimes called reconfigured) for use at a lower storage density than the storage density previously used (e.g., storage density is reduced from X3 to X2). Furthermore, in another example, if the age metric of an NVM device 140 exceeds a predefined threshold, a stronger ECC is used (e.g., using LDPC over BCH). Furthermore, in another example, if the age metric of NVM device 140-*n* exceeds a predefined threshold, a wear leveling setting is adjusted such that storage controller 130 programs and erases blocks of NVM device 140-*n* less frequently than other NVM devices of an array (e.g., NVM devices 140-1 and 140-2) having age metrics that do not exceed the predefined threshold criteria.

In some embodiments, the non-volatile memory device includes (550) one or more three-dimensional (3D) memory devices and circuitry associated with operation of memory elements in the one or more 3D memory devices. Furthermore, in some implementations, the circuitry and one or more memory elements in a respective 3D memory device, of the one or more 3D memory devices, are on the same substrate (552).

After the adjusting, data is read from and data is written to (554) the portion of the non-volatile memory device according to the one or more adjusted configuration parameters.

Optionally, at least the characteristic of the measured current is stored (556) in a register. Current registers are described in greater detail above with respect to FIG. 1.

In some implementations, with respect to any of the methods described above, the storage device includes (1) an interface for coupling the storage device to a host system, (2) a plurality of non-volatile memory controllers, each controller of the plurality of controllers configured to manage execution of commands in one or more command queues managed by controller, and (3) a plurality of distinct sets of non-volatile memory devices, each controlled by a corresponding one of the non-volatile memory controllers.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible (e.g., a NOR memory array). NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The term "three-dimensional memory device" (or 3D memory device) is herein defined to mean a memory device having multiple memory layers or multiple levels (e.g., sometimes called multiple memory device levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

One of skill in the art will recognize that this invention is not limited to the two dimensional and three dimensional exemplary structures described but cover all relevant memory structures within the spirit and scope of the invention as described herein and as understood by one of skill in the art.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of operation in a non-volatile memory device, the method comprising:
    executing a memory operation in a portion of the non-volatile memory device;
    measuring a current corresponding to total current drawn by at least the portion of the non-volatile memory device over the duration of a sampling window for the memory operation;
    determining an age metric for at least the portion of the non-volatile memory device based on the measured current;
    in accordance with a determination that the age metric satisfies one or more predefined threshold criteria, adjusting one or more configuration parameters associated with at least the portion of the non-volatile memory device; and
    after the adjusting, reading data from and writing data to the portion of the non-volatile memory device according to the one or more adjusted configuration parameters.

2. The method of claim 1, wherein the one or more adjusted configuration parameters include at least one of:
    a storage density of the non-volatile memory device or the portion of the non-volatile memory device;
    an error correction code (ECC) strength; and
    a wear leveling setting.

3. The method of claim 1, wherein the age metric is a numerical metric having a value that varies with changes in the measured current.

4. The method of claim 1, wherein the duration of the sampling window comprises the duration of the memory operation.

5. The method of claim 1, wherein measuring the current is from a physical location internal to the non-volatile memory device.

6. The method of claim 1, wherein measuring the current includes measuring the current drawn across one or more bit lines corresponding to the portion of the non-volatile memory device.

7. The method of claim 1, wherein the age metric is a numerical metric having a value that varies with changes in the measured current, and determining the age metric is based on the measured current and one or more additional factors selected from the group consisting of:
    a program-erase (PE) cycle count corresponding to a number of PE cycles performed on the portion of the non-volatile memory device;
    a number of erase loops required for successfully executing the memory operation, wherein the memory operation is an erase operation; and
    a measured bit error rate (BER) of the portion of the non-volatile memory device.

8. The method of claim 1, wherein the non-volatile memory device comprises one or more three-dimensional (3D) memory devices and circuitry associated with operation of memory elements in the one or more 3D memory devices.

9. The method of claim 8, wherein the circuitry and one or more memory elements in a respective 3D memory device, of the one or more 3D memory devices, are on the same substrate.

10. A memory system, comprising:
    a plurality of non-volatile memory devices;
    a plurality of memory controllers;
    a processor; and
    memory for storing one or more programs for execution by the processor, the one or more programs including instructions for performing operations comprising:
        initiating execution of a memory operation in a portion of a non-volatile memory device;
        measuring a current corresponding to total current drawn by at least the portion of the non-volatile memory device over the duration of a sampling window for the memory operation;
        determining an age metric for at least the portion of the non-volatile memory device based on the measured current;
        in accordance with a determination that the age metric satisfies one or more predefined threshold criteria, adjusting one or more configuration parameters associated with at least the portion of the non-volatile memory device; and
        after the adjusting, reading data from and writing data to the portion of the non-volatile memory device according to the one or more adjusted configuration parameters.

11. The memory system of claim 10, wherein the one or more adjusted configuration parameters include at least one of:
    a storage density of the non-volatile memory device or the portion of the non-volatile memory device;
    an error correction code (ECC) strength; and
    a wear leveling setting.

12. The memory system of claim 10, wherein the age metric is a numerical metric having a value that varies with changes in the measured current.

13. The memory system of claim 10, wherein the duration of the sampling window comprises the duration of the memory operation.

14. The memory system of claim 10, wherein measuring the current is from a physical location internal to the non-volatile memory device.

15. The memory system of claim 10, wherein measuring the current includes measuring the current drawn across one or more bit lines corresponding to the portion of the non-volatile memory device.

16. The memory system of claim 10, wherein the age metric is a numerical metric having a value that varies with changes in the measured current, and determining the age metric is based on the measured current and one or more additional factors selected from the group consisting of:
- a program-erase (PE) cycle count corresponding to a number of PE cycles performed on the portion of the non-volatile memory device;
- a number of erase loops required for successfully executing the memory operation, wherein the memory operation is an erase operation; and
- a measured bit error rate (BER) of the portion of the non-volatile memory device.

17. The memory system of claim 10, wherein the non-volatile memory device comprises one or more three-dimensional (3D) memory devices and circuitry associated with operation of memory elements in the one or more 3D memory devices.

18. The memory system of claim 17, wherein the circuitry and one or more memory elements in a respective 3D memory device, of the one or more 3D memory devices, are on the same substrate.

19. A non-transitory computer readable storage medium, storing one or more programs for execution by one or more processors, the one or more programs including instructions for performing operations comprising:
- initiating execution of a memory operation in a portion of a non-volatile memory device;
- measuring a current corresponding to total current drawn by at least the portion of the non-volatile memory device over the duration of a sampling window for the memory operation;
- determining an age metric for at least the portion of the non-volatile memory device based on the measured current;
- in accordance with a determination that the age metric satisfies one or more predefined threshold criteria, adjusting one or more configuration parameters associated with at least the portion of the non-volatile memory device; and
- after the adjusting, reading data from and writing data to the portion of the non-volatile memory device according to the one or more adjusted configuration parameters.

20. The non-transitory computer readable storage medium of 19, wherein the one or more adjusted configuration parameters include at least one of:
- a storage density of the non-volatile memory device or the portion of the non-volatile memory device;
- an error correction code (ECC) strength; and
- a wear leveling setting.

21. The non-transitory computer readable storage medium of 19, wherein the age metric is a numerical metric having a value that varies with change in the measured current.

22. The non-transitory computer readable storage medium of 19, wherein the duration of the sampling window comprises the duration of the memory operation.

23. The non-transitory computer readable storage medium of 19, wherein measuring the current is from a physical location internal to the non-volatile memory device.

24. The non-transitory computer readable storage medium of 19, wherein measuring the current includes measuring the current drawn across one or more bit lines corresponding to the portion of the non-volatile memory device.

25. The non-transitory computer readable storage medium of 19, wherein the age metric is a numerical metric having a value that varies with changes in the measured current, and determining the age metric is based on the measured current and one or more additional factors selected from the group consisting of:
- a program-erase (PE) cycle count corresponding to a number of PE cycles performed on the portion of the non-volatile memory device;
- a number of erase loops required for successfully executing the memory operation, wherein the memory operation is an erase operation; and
- a measured bit error rate (BER) of the portion of the non-volatile memory device.

26. The non-transitory computer readable storage medium of 19, wherein the non-volatile memory device comprises one or more three-dimensional (3D) memory devices and circuitry associated with operation of memory elements in the one or more 3D memory devices.

27. The non-transitory computer readable storage medium of 26, wherein the circuitry and one or more memory elements in a respective 3D memory device, of the one or more 3D memory devices, are on the same substrate.

* * * * *